United States Patent
Hayakawa (10) Patent No.: US 8,189,370 B2
(45) Date of Patent: May 29, 2012

(54) MAGNETIC RECORDING ELEMENT, MAGNETIC MEMORY CELL, AND MAGNETIC RANDOM ACCESS MEMORY

(75) Inventor: Jun Hayakawa, Hino (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/058,202

(22) PCT Filed: Aug. 17, 2009

(86) PCT No.: PCT/JP2009/064380
§ 371 (c)(1),
(2), (4) Date: Feb. 9, 2011

(87) PCT Pub. No.: WO2010/032574
PCT Pub. Date: Mar. 25, 2010

(65) Prior Publication Data
US 2011/0134689 A1    Jun. 9, 2011

(30) Foreign Application Priority Data

Sep. 22, 2008    (JP) ................................. 2008-242998

(51) Int. Cl.
*G11C 11/15* (2006.01)
*G11C 11/22* (2006.01)

(52) U.S. Cl. ......... 365/158; 365/171; 365/173; 365/145

(58) Field of Classification Search .................. 365/171, 365/173, 158, 145
See application file for complete search history.

(56) References Cited

U.S. PATENT DOCUMENTS

| 5,695,864 A | 12/1997 | Slonczewski |
| 7,750,390 B2 * | 7/2010 | Saito et al. ................... 257/314 |
| 2002/0105827 A1 | 8/2002 | Redon et al. |
| 2006/0133137 A1 | 6/2006 | Shin et al. |
| 2007/0014143 A1 * | 1/2007 | Doudin .......................... 365/145 |
| 2007/0164336 A1 * | 7/2007 | Saito et al. ..................... 257/295 |
| 2009/0067224 A1 * | 3/2009 | Hochstrat et al. ............. 365/158 |
| 2009/0096045 A1 | 4/2009 | Hayakawa et al. |
| 2010/0080048 A1 * | 4/2010 | Liu et al. ....................... 365/157 |

FOREIGN PATENT DOCUMENTS

| JP | 2002-305337 A | 10/2002 |
| JP | 2004-179219 A | 6/2004 |
| JP | 2005-209870 A | 8/2005 |
| JP | 2006-179891 A | 7/2006 |
| JP | 2007-59879 A | 3/2007 |

OTHER PUBLICATIONS

S. Yuasa et al., Giant room-temperature magnetoresistance in single-crystal Fe/MgO/Fe magnetic tunnel junctions, Nature Material, vol. 3, Dec. 2004, pp. 868-871.
V. Laukhin et al., Electric-Field Control of Exchange Bias in Multiferroic Epitaxial Heterostructures, Physical Review Letters, Dec. 1, 2006, pp. 227201-01-227201-04.

* cited by examiner

*Primary Examiner* — Hoai V Ho
*Assistant Examiner* — Jay Radke
(74) *Attorney, Agent, or Firm* — Mattingly & Malur, PC (57) ABSTRACT

A low-power consumption non-volatile memory employing an electric field write magnetic recording element is provided. A multiferroic layer 301 is provided adjacent to a magnetic recording layer 2002, and by applying an electric field to the multiferroic layer to control the dielectric state of the multiferroic, the magnetization direction of the magnetic recording layer is controlled and information is written. Reading is performed by electrically detecting the magnetization direction of the magnetic recording layer by way of a magnetoresistive effect.

11 Claims, 9 Drawing Sheets

MAGNETIC RECORDING ELEMENT, MAGNETIC MEMORY CELL, AND MAGNETIC RANDOM ACCESS MEMORY

TECHNICAL FIELD

The present invention relates to a magnetic recording element that writes magnetic information by means of an electric field, and to a low power consumption non-volatile magnetic memory equipped with same.

BACKGROUND ART

Regarding tunnel magnetoresistive elements to be employed in future highly-integrated magnetic memories, S. Yuasa et al., Nature Material 3, 868 (2004), and JP 2007-59879 A disclose tunnel magnetoresistive elements employing magnesium oxide for the insulating film, which provide for magnetoresistance ratios that are several times greater than those of tunnel magnetoresistive elements employing oxides of A1 for an insulator. Further, conventional non-volatile magnetic memories comprise a memory cell in which a tunnel magnetoresistive element is formed on a MOSFET. Switching is a method in which, using a MOSFET, information is written by rotating the magnetization direction of a tunnel magnetoresistive element using an electrically induced spatial magnetic field that is generated by passing a current through a bit line and a word line, and information is read by means of an output voltage of the tunnel magnetoresistive element. Further, in addition to magnetization rotation using the above-mentioned electrically induced spatial magnetic field, there is also the so-called spin transfer torque magnetization reversal method, or the synonymous spin injection magnetization reversal method, which rotates magnetization by directly passing a current through a magnetoresistive element, as disclosed in, for example, U.S. Pat. No. 5,695,864 or JP 2002-305337 A. Further, regarding a method of reversing magnetization using an electric field, an example using multiferroics is disclosed in V. Laukhin et al., Physical Review Letters 97, 227201 (2006).

PRIOR ART DOCUMENTS

Patent Documents

Patent Document 1: JP 2007-59879 A
Patent Document 2: U.S. Pat. No. 5,695,864
Patent Document 3: JP 2002-305337 A

Non-Patent Documents

Non-Patent Document 1: Nature Material 3, 868 (2004)
Non-Patent Document 2: Physical Review Letters 97, 227201 (2006)

SUMMARY OF THE INVENTION

Problems to be Solved by the Invention

In order to realize general-purpose non-volatile magnetic memories, it is necessary to develop a technique that simultaneously provides for low power consumption and high thermal stability.

An object of the present invention is to provide a magnetic recording element that is capable of meeting such demands and of electric field magnetic writing, as well as a non-volatile magnetic memory using same.

Means for Solving the Problems

The present invention provides a magnetic recording element, as well as a magnetic memory and magnetic random access memory using same, in which a multiferroic layer is placed adjacent to a magnetic recording layer either in direct contact therewith or with an insulator in-between, and in which information is written by controlling the magnetization direction of the magnetic recording layer by applying an electric field to the multiferroic layer and controlling the dielectric state of the multiferroic. In such an element or memory, a read-out layer that reads out the magnetization direction of the magnetic recording layer electrically is provided. The multiferroic layer is a layer that has both properties of an antiferromagnet and a ferroelectric.

A magnetic recording element of the present invention comprises: a magnetic recording layer having a top surface and a bottom surface; a multiferroic layer provided adjacent to one of the top and bottom surfaces of the magnetic recording layer; a read-out layer provided adjacent to the other surface of the magnetic recording layer; a first electrode layer provided on the side of the recording layer on which the multiferroic layer is provided side; a second electrode layer provided on the side of the recording layer on which the read-out layer is provided side; and an electrode different from the first and second electrode layers coupled with the magnetic recording layer, wherein the magnetic recording layer has its magnetization direction set (or switched by way of magnetic exchange coupling that is at work between itself and the multiferroic layer, the magnetic recording element varies in electric resistance in accordance with the magnetization direction of the magnetic recording layer, magnetic information is written through rotation of the magnetization direction of the magnetic recording layer by applying an electric field to the multiferroic layer via the first electrode layer and the second electrode layer, and a signal corresponding to the electric resistance of the magnetic recording element is obtained from the read out layer via the second electrode layer and the electrode coupled with the magnetic recording layer. An insulating layer may also be provided between the multiferroic layer and the first electrode layer.

A magnetic memory cell of the present invention comprises: a magnetic recording element comprising a magnetic recording layer having a to surface and a bottom surface, a multiferroic layer provided adjacent to one of the top and bottom surfaces of the magnetic recording layer, a read-out layer provided adjacent to another surface of the magnetic recording layer from which a signal is outputted to detect the resistance of the magnetic recording element which varies in electric resistance in accordance with a magnetization direction of the magnetic recording layer, a first electrode layer provided on the side of the recording layer on which the multiferroic layer is provided; a second electrode layer provided on the side of the recording layer on which the read-out layer is provided side, and an electrode different from the first and second electrode layers coupled with the magnetic recording layer, wherein the magnetic recording layer has its magnetization direction fixed by way of magnetic exchange coupling that is at work between itself and the multiferroic layer; a write circuit comprising a first power source, and a first switching element that performs on/off control of voltage application by the first power source, wherein the write circuit is coupled with the first electrode layer and the second electrode layer, and writes magnetic information through rotation of the magnetization direction of the magnetic recording layer by applying an electric field to the multiferroic layer; and a read-out circuit comprising a second power source, and a second switching element that performs on/off control of a voltage or voltage application by the second power source, wherein the read-out circuit is coupled with the second electrode layer and the electrode coupled with the magnetic recording layer, and obtains a signal corresponding to the electric resistance of the magnetic recording element.

In addition, a magnetic random access memory of the present invention comprises: a plurality of magnetic memory cells; and means that selects a desired magnetic memory cell, wherein a magnetic memory cell of the present invention mentioned above is used as the magnetic memory cells.

Effects of the Invention

According to the present invention, writing magnetic information to the magnetic recording layer by means of a voltage on the order of several tens of millivolts is made possible. Further, it is expected that a thermal stability factor of 1,000 or greater may be realized with respect to the magnetic recording layer. A magnetic recording element of the present invention is employed in magnetic memory cells and magnetic random access memories, and enables the realization of general-purpose low-power consumption non-volatile magnetic memories.

MODES FOR CARRYING OUT THE INVENTION

Modes for carrying out the present invention are described below with reference to the drawings. With the electric field write magnetic recording elements discussed below, the magnitude of the magnetic exchange coupling at work between the multiferroic layer and the magnetic recording layer is controlled by applying an electric field to the multiferroic layer, thereby controlling the direction of magnetization of the magnetic recording layer. The electric field (voltage) threshold at which magnetization reversal occurs is herein defined as $E_c$ ($V_c$).

Embodiment 1

Figure 1:
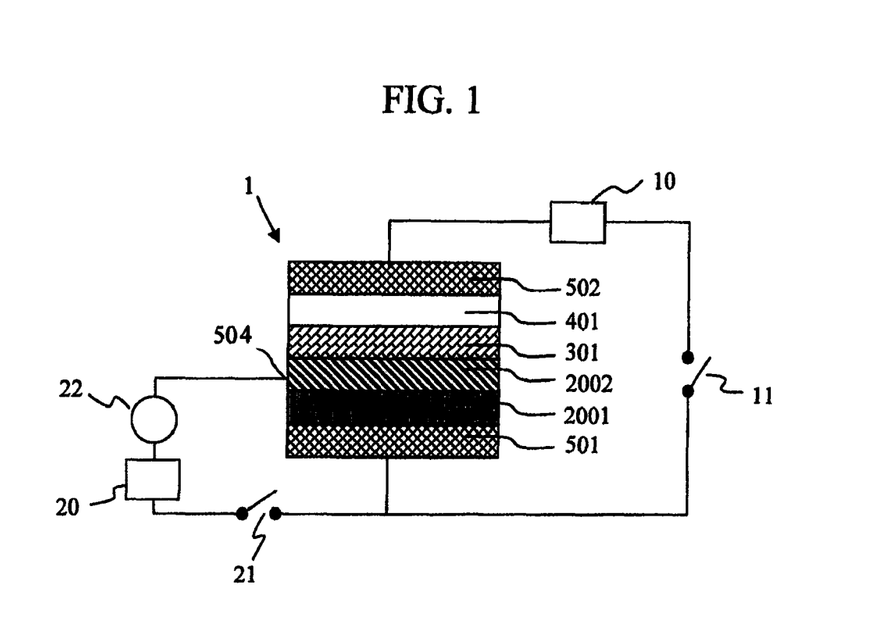
FIG. 1 is a view showing a configuration example of an electric field write magnetic recording element of the present invention.

FIG. 1 is a schematic sectional view showing an example of an electric field write magnetic recording element according to the present invention. The magnetic recording element of the present embodiment is fabricated using a sputtering method. However, it may also be fabricated using some other method, such as molecular beam atomic layer deposition, etc.

An electric field write magnetic recording element 1 has such a structure, wherein a read-out layer 2001, a magnetic recording layer 2002, a multiferroic layer 301, an insulating layer 401, and a write electrode layer 502 are layered in this order from the side of the magnetic recording element having an electrode layer 501. It is noted that it is also possible to employ a configuration in which, in reverse to the layer order shown in FIG. 1, the write electrode 502 is disposed on the bottom substrate side, and the insulating layer 401, the multiferroic layer 301, the magnetic recording layer 2002, the read-out layer 2001, and the electrode layer 501 are layered thereon in this order. The multiferroic layer 301 is a material layer having both properties of an antiferromagnet and a ferroelectric. Thus, the magnetization of the magnetic recording layer 2002 is set (or switched) in a given direction by way of the magnetic exchange coupling between itself and the multiferroic layer 301 as an antiferromagnet.

A write circuit including a power source 10 and a switch element 11 is coupled with the electrode layer 501 and the write electrode layer 502. When writing, the switch 11 is closed to apply a voltage or a current to the multiferroic layer 301. Further, a read-out circuit comprising a power source 20, a switch element 21, and a detector 22 that detects a voltage or a current is coupled to the electrode layer 501 and, through an electrode 504 coupled to the magnetic recording layer 2002, to the magnetic recording layer 2002, and an electric signal of from the read-out layer 2001 is read out by way of a voltage or a current. For the detector 22, a voltmeter or an ammeter may be used.

The read-out layer 2001 has a function of enabling the detection a change in the magnetization direction of the magnetic recording layer 2002 as a change in the electric resistance from the recording layer to the read out layer, and may employ a material that exhibits a magnetoresistive effect such as, for example, an anisotropic magnetoresistive effect, a giant magnetoresistive effect, a tunnel magnetoresistive effect, etc.

Figure 2:
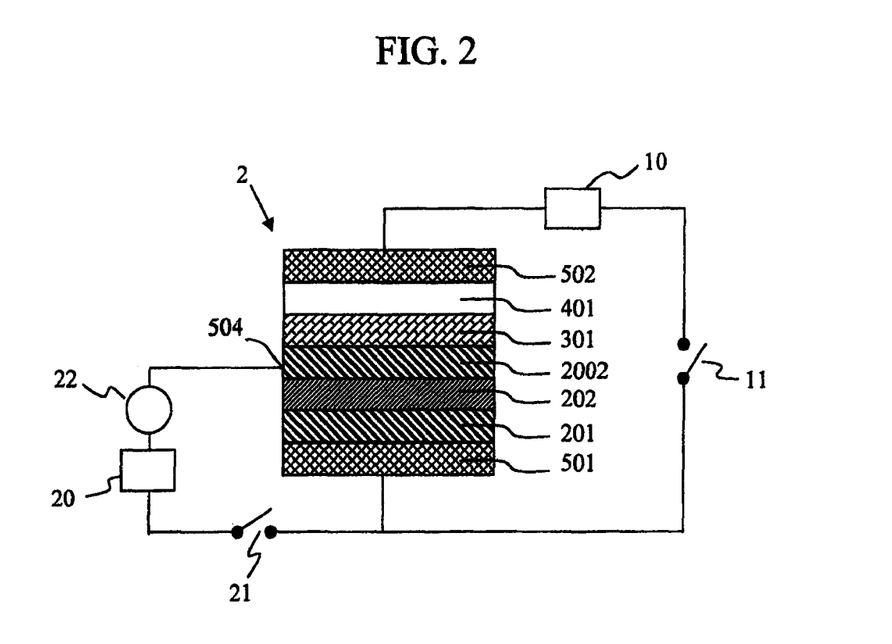
FIG. 2 is a view showing a configuration example of an electric field write magnetic recording element of the present invention.

FIG. 2 shows a variation of the electric field write element shown in FIG. 1. An electric field write element 2 shown in FIG. 2 represents a configuration example of an element in which the read-out layer comprises a bather layer 202 that is in contact with the magnetic recording layer 2002, and a magnetic fixed layer 201 that is in contact with the barrier layer 202, wherein the magnetization state of the magnetic recording layer 2002 is electrically read out by way of a tunnel magnetoresistive effect.

Figure 3:
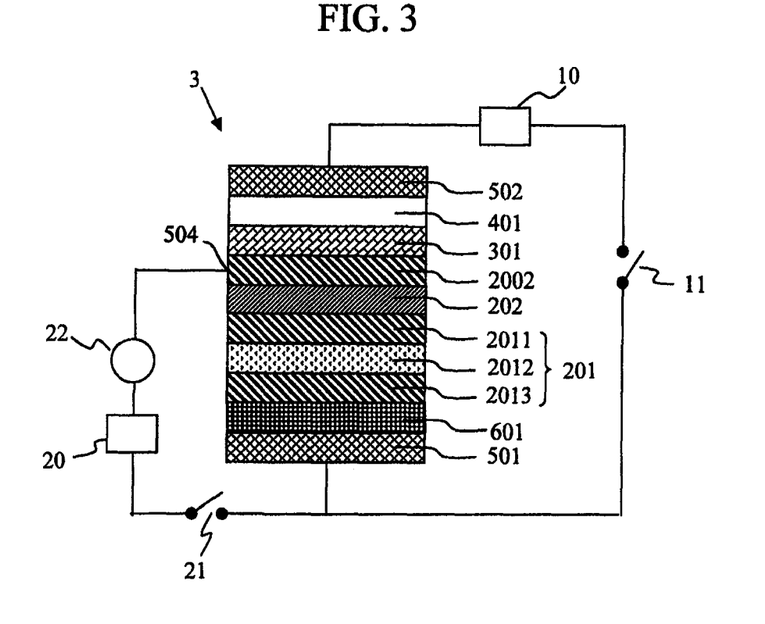
FIG. 3 is a view showing a configuration example of an electric field write magnetic recording element of the present invention.

In addition, FIG. 3 shows a variation of the electric field write element shown in FIG. 2. An electric field write element 3 shown in FIG. 3 is one in which the fixing force for the magnetization of the magnetic fixed layer is stabilized by using an antiferromagnetic layer 601 of MnIr, MnPt, CrMnPt, CrMnIr, MnFe, etc., as a means for fixing the magnetization direction of the magnetic fixed layer 201, thereby causing exchange coupling between the magnetic fixed layer and the antiferromagnetic layer. Further, it is made to be of a structure that stabilizes the fixing force for the magnetization of the magnetic fixed layer by making the magnetic fixed layer 201 be of a layered ferrimagnetic structure in which, as in CoFeB/Ru/CoFe, a first magnetic layer 2011 and a second magnetic layer 2013 are layered with a non-magnetic layer 2012 sandwiched therebetween, and the magnetizations of the two magnetic layers 2011 and 2013 are coupled in an antiparallel manner.

Figure 4:
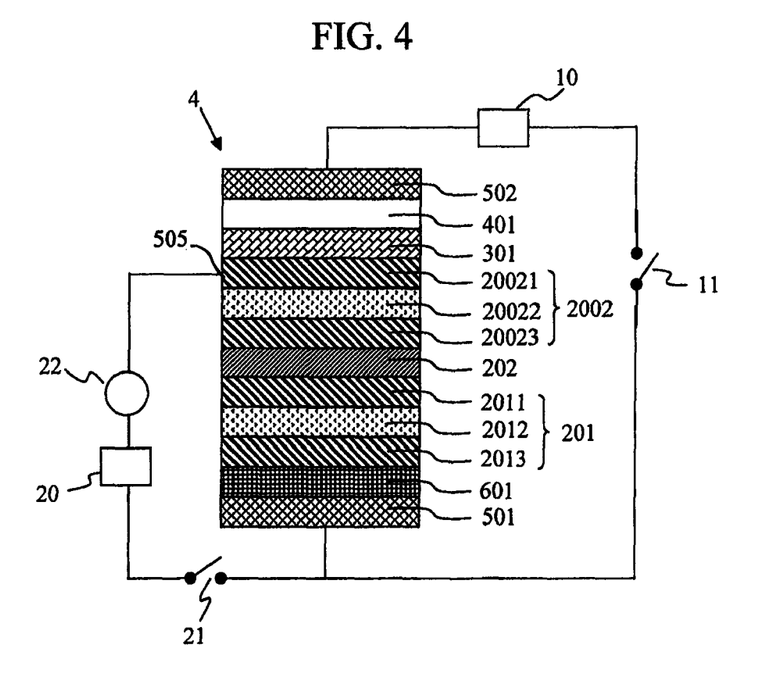
FIG. 4 is a view showing a configuration example of an electric field write magnetic recording element of the present invention.

An electric field write element 4 shown in FIG. 4 represents a variation of the electric field write element shown in FIG. 3, and is one in which a layered ferrimagnetic structure having such a structure where a non-magnetic layer 20022 is sandwiched by two magnetic layers 20021 and 20023 and where the magnetizations of the two magnetic layers 20021 and 20023 are coupled in an antiparallel manner is applied to the magnetic recording layer 2002. For the non-magnetic layer to be used in this case, it is preferable that Ru, etc., be employed. Further, the detector 22 is coupled to the magnetic layer 20021 by an electrode 505.

A typical fabrication method for an electric field write magnetic recording element using the tunnel magnetoresistive element shown in FIG. 2 will now be described.

First, the multiferroic layer 301 is discussed. The term multiferroics refers to materials having both magnetic properties and properties of a dielectric, and is formed mainly by oxides. For the multiferroic layer to be used in an electric field write magnetic recording element of the present invention, a material having both antiferromagnetic and ferroelectric properties is preferable, such as $BiFeO_3$, $YMnO_3$, $CoFeO_2$, $Cr_2O_3$, etc. For the magnetic recording layer 2002 and the magnetic fixed layer 201, it is preferable to use a material including at least one element from Co, Fe and Ni, and containing B therein. Examples thereof are shown in Table 1.

TABLE 1

| $(Co_xFe_{1-x})_{1-y}B_y$ |
|---|
| ($0 \leq x \leq 100, 0 \leq y \leq 30$) (including CoB, FeB) |
| $(Ni_xFe_{1-x})_{1-y}B_y$ |
| ($0 \leq x \leq 100, 0 \leq y \leq 30$) (including NiB, FeB) |
| $(Co_xNi_zFe_{1-x-z})_{1-y}B_y$ |
| ($0 \leq x \leq 100, 0 \leq y \leq 30, 0 \leq z \leq 100$) |

Next, material selection for the barrier layer 202 is discussed. While it is most preferable that MgO be used for the barrier layer 202, it is also possible to use oxides such as AlO, $SiO_2$, semiconductor materials such as GaAs, ZnSe, etc., or nitrides such as AlN, SiN, etc. In particular, where MgO is used for the barrier layer 202, by using CoFeB of a body-centered cubic lattice structure for the magnetic recording layer 2002 and the magnetic fixed layer 201, it is possible to obtain a greater tunnel magnetoresistive effect, i.e., a greater read-out output signal. In this case, it is most preferable that both MgO and CoFeB be formed of a highly (100) oriented thin film, and that the composition of CoFeB be $CO_{20}Fe_{60}B_{20}$. For the material to be used for the insulating layer 401, it is preferable to use a material with a high dielectric constant, such as oxides of Si or Al like SiO, $Al_2O_3$, etc. As alternative materials, nitrides, such as SiN, etc., may also be used. The write electrode layer 502 and the electrode layer 501 may also be formed with a two-layer film or a multi-layer film such as W and TiN, or TiN and AlCu, etc. It is also preferable to use a material indicated in Table 1 as the material of the magnetic layers to be used in the magnetic recording layer 2002 of the electric field write magnetic recording element shown in FIG. 4.

The electric field write magnetic recording film thus formed is formed into an electric field write magnetic recording element having an area of 0.1 µm×0.15 µm using photolithography, ion milling, a reactive etching method, etc.

Next, writing and reading methods for an electric field write magnetic recording element according to the present invention are described. When writing, by applying a voltage across the electrode layer 501 and the write electrode layer 502, an electric field is applied to the multiferroic layer. As a result, the magnitude of the exchange coupling energy at work between the multiferroic layer 301 and the magnetic recording layer 2002 varies, and the magnetization direction of the magnetic recording layer 2002 is controlled. At the interface of multiferroics, there is a correlation between the direction of electric polarization and the direction of magnetization, and as the direction of electric polarization reverses, so does magnetization. Since magnetic exchange coupling is at work at the interface between the multiferroic layer and the magnetic recording layer, the magnetization direction of the magnetic recording layer aligns with the magnetization direction of the interface of the multiferroic layer. Thus, by applying an external electric field to the multiferroic layer to thereby reverse the direction of electric polarization thereof, the magnetization direction of the magnetic recording layer also rotates.

Figure 5A:
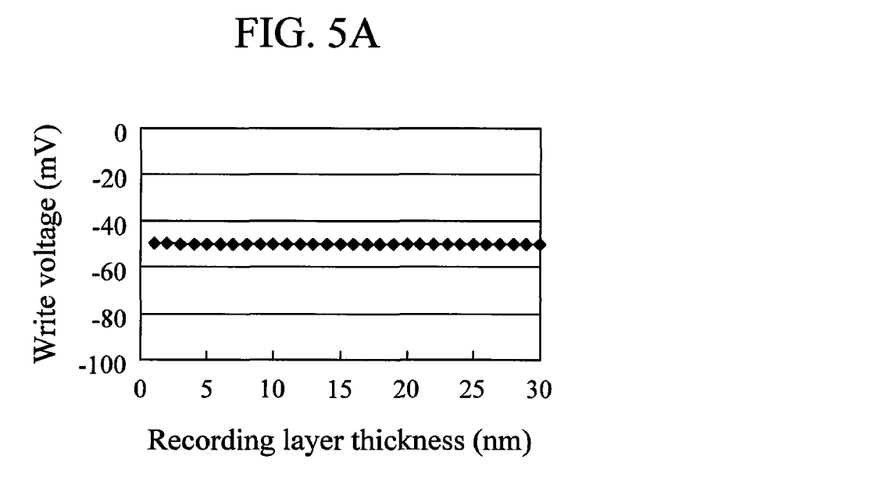
FIGS. 5A and 5B are diagrams showing the relationship between write voltage and magnetic recording layer thickness.
Figure 5B:
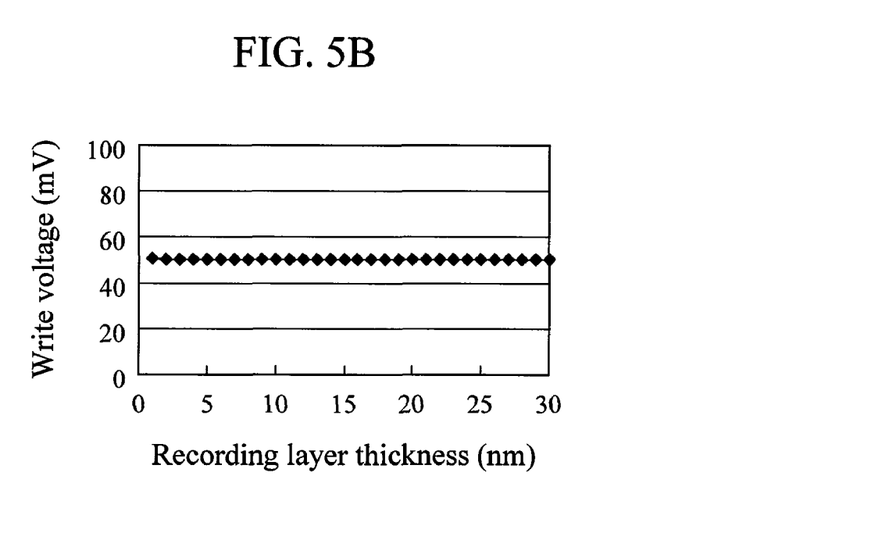

The dependence of write voltage ($V_c$) on magnetic recording layer thickness is shown in FIGS. 5A and 5B with respect to a case where $BiFeO_3$ is used for the multiferroic layer and CoFeB for the magnetic recording layer. FIG. 5A shows characteristics in a case where the magnetization directions of the magnetic recording layer and the magnetic fixed layer switch from antiparallel to parallel, and FIG. 5B shows characteristics in a case where the magnetization directions of the magnetic recording layer and the magnetic fixed layer switch from parallel to antiparallel. In both cases, it can be seen that the write voltage shows almost no change even when the recording layer thickness varies.

Details of the principles of electric field writing of the present invention are described using FIGS. 6A to 6C and FIGS. 7A to 7C. As in FIG. 6A, the multiferroic layer 301 and the magnetic recording layer 2002 are layered adjacently, and a voltage is applied thereacross to apply electric field E to the multiferroic layer. Here, the direction of the electric field generated when a higher positive voltage is applied to the multiferroic layer 301 relative to the recording layer 2002 is defined as the positive electric field direction. As electric field E is varied, the sign of the magnitude of magnetization M of the magnetic recording layer 2002 reverses at thresholds ($+E_c, -E_u$) as in FIG. 6B. In other words, the magnetization direction of the magnetic recording layer 2002 is reversed by a threshold electric field. With an electric field of $+E_c$ or greater, the direction of electric polarization p of the multiferroic layer 301 faces upward from below the thin film, and magnetization direction m of the magnetic recording layer 2002 faces rightward in dependence on that electric polarization direction. On the other hand, with an electric field of $-E_c$ or below, the direction of electric polarization p of the multiferroic layer 301 faces downward from above the thin film, and magnetization direction m of the magnetic recording layer 2002 faces leftward in dependence on that electric polarization direction. This is due to the fact that the magnitude of the magnetic exchange coupling at work between the multiferroic layer 301 and the magnetic recording layer 2002 is dependent on the magnitude and direction of the electric polarization of the multiferroic layer 301.

Figure 7A:
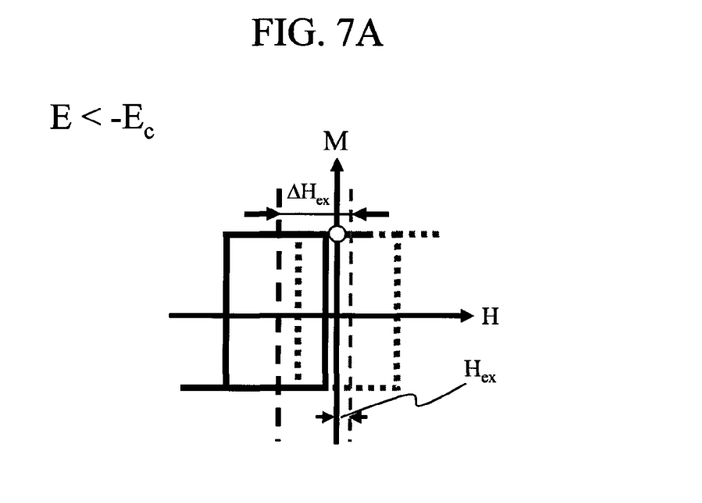
FIGS. 7A to 7C are diagrams showing the principles of electric field writing.
Figure 7B:
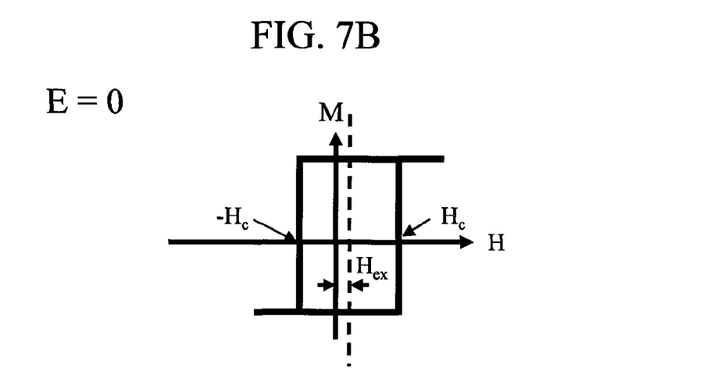

When no electric field is applied, that is, when electric field E=0, the response of magnetization M of the magnetic recording layer 2002 to external magnetic field H is as shown in FIG. 7B, and the magnetization direction of the magnetic recording layer 2002 reverses at coercivity (Hc, −Hc) of the magnetic recording layer 2002. Here, as in FIG. 6B, the magnetic field direction with which the magnetization of the magnetic recording layer faces rightward is defined as a positive magnetic field. In so doing, since magnetic exchange coupling is at work between the multiferroic layer 301 and the magnetic recording layer 2002, the magnetization-external magnetic field curve for the magnetic recording layer 2002 shifts away from zero by an amount corresponding to magnetic exchange coupling magnetic field Hex thereof.

Figure 7C:
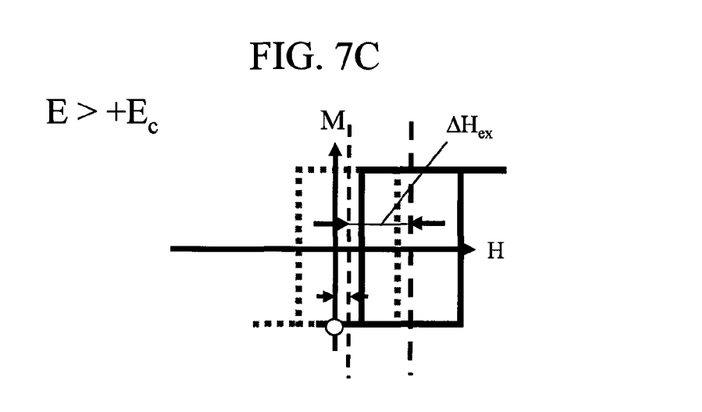

As shown in FIG. 7A, when a negative electric field is applied to the multiferroic layer 301, the magnitude of magnetic exchange coupling magnetic field Hex varies by ΔHex in proportion to the magnitude of the electric field. Consequently, the magnetization-external magnetic field curve for the magnetic recording layer 2002 shifts in the negative direction of external magnetic field H. Once the electric field reaches threshold electric field $-E_c$, the magnetization of the magnetic recording layer 2002 switches from negative to positive to enter the state of the white circle. On the other hand, as shown in FIG. 7C, when a positive electric field is applied, the magnitude of magnetic exchange coupling magnetic field Hex varies by ΔHex in proportion to the magnitude of that electric field. Consequently, the magnetization-external magnetic field curve for the magnetic recording layer 2002 shifts in the positive direction of external magnetic field H in proportion to the magnitude of the electric field. Once the electric field reaches threshold electric field $+E_c$, the magnetization of the magnetic recording layer 2002 switches from positive to negative to enter the state of the white circle.

Figure 6A:
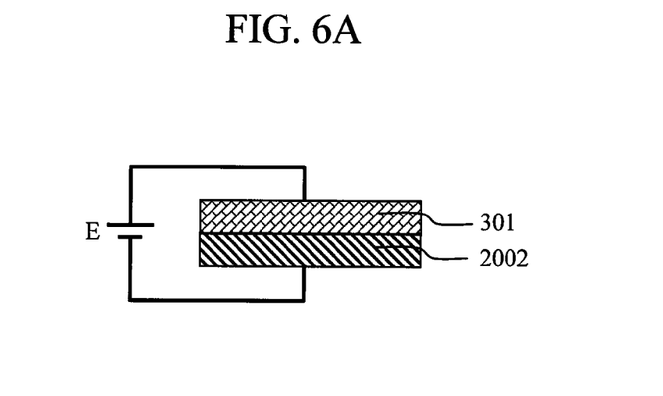
FIG. 6A is a diagram showing a layered structure of a multiferroic layer and a magnetic recording layer.
Figure 6B:
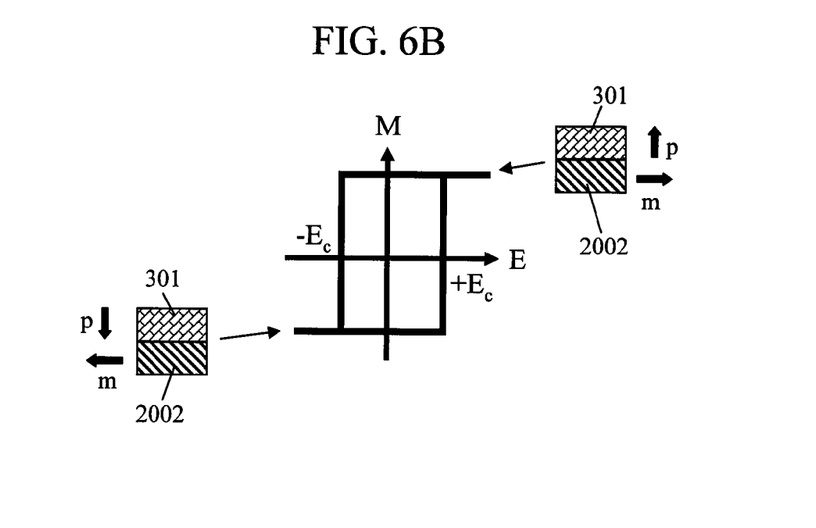
FIGS. 6B and 6C are diagrams showing an example of the characteristics and principles of electric field writing.
Figure 6C:
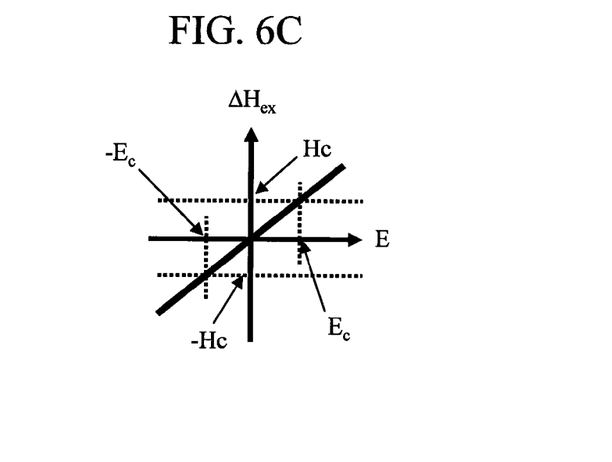

Thus, as the magnitude and direction of the electric field applied to the multiferroic layer 301 is varied, the magnetization direction of the magnetic recording layer 2002 switches. The magnitude of electric field threshold (Ec) for magnetization reversal is determined by the magnitude of coercivity Hc of the magnetic recording layer 2002. As shown in FIG. 6C, the electric field that causes change ΔHex in magnetic exchange coupling magnetic field Hex corresponding to the magnitude of coercivity Hc of the magnetic recording layer 2002 becomes reversing electric field threshold $E_c$ of the magnetic recording layer 2002.

Next, with respect to a reading method, it is preferable to use a material that exhibits a magnetoresistive effect, such as an anisotropic magnetoresistive element, a giant magnetoresistive element, a tunnel magnetoresistive element, etc., having a function of being capable of detecting a change in the magnetization direction of the magnetic recording layer 2002 as a change in electric resistance of the magnetic recording element. An example in which a tunnel magnetoresistive effect, which stably exhibits a large magnetoresistive effect, is employed is herein discussed.

A current (voltage) is applied across the magnetic recording layer 2002 and the magnetic fixed layer 201 via the barrier layer 202, and reading is performed by way of a tunnel magnetoresistive effect whereby electric resistance varies in dependence on the relative angle between the magnetization directions of the magnetic recording layer 2002 and the magnetic fixed layer 201. When CoFeB is used for the magnetic recording layer 2002 and the magnetic fixed layer 201, and MgO for the barrier layer 202, electric resistance varies by up to 600% between when the magnetization directions of the magnetic recording layer 2002 and the magnetic fixed layer 201 are parallel and when they are antiparallel. This change is detected by the read-out circuit and the magnetization direction of the magnetic recording layer 2002 is detected.

An effect that the present invention has on the thermal stability ($E/k_BT$) of the magnetic recording layer 2002 is herein described. E represents the magnitude of the energy required for magnetization reversal, and by having a sufficiently large value with respect to thermal energy $k_BT$, stable and reliable magnetic information retention becomes possible. With magnetic recording elements employing spin transfer torque magnetization reversal in their writing methods, increasing $E/k_BT$ for the magnetic recording layer thereof results in an increase in spin transfer torque magnetization reversal current density, which is problematic.

Figure 8:
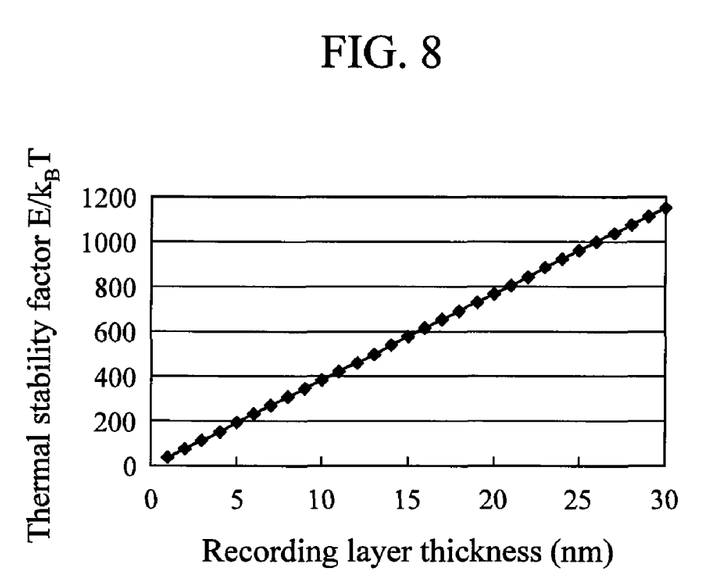
FIG. 8 is a diagram showing the relationship between thermal stability factor $E/k_BT$ and magnetic recording layer thickness.

FIG. 8 is a diagram wherein $E/k_BT$ is plotted against the thickness of the magnetic recording layer 2002 with respect to a case where CoFeB is used for the magnetic recording layer 2002 of an electric field write magnetic recording element of the present invention. $E/k_BT$ increases in proportion to the thickness of the magnetic recording layer 2002, and, by way of example, it becomes possible to realize $E/k_BT>1,000$ with respect to a magnetic recording layer 2002 of 25 nm or greater. On the other hand, as shown in FIG. 5A and FIG. 5B, the write voltage is mostly not dependent on the thickness of the magnetic recording layer 2002. Thus, it is possible to freely select the magnitude of $E/k_BT$ by way of the thickness of the magnetic recording layer 2002 without any increase in write voltage.

Embodiment 2

Embodiment 2 of an electric field write magnetic recording element according to the present invention is described. The series of Embodiment 2 is of a configuration in which the insulating layer 401 is omitted from the configuration of the series of Embodiment 1. In the case of the present embodiment, by applying an electric field directly to the multiferroic layer 301, the controllability of that applied electric field improves, as a result of which it is possible to improve pressure resistance by increasing the thickness of the multiferroic layer.

Figure 9:
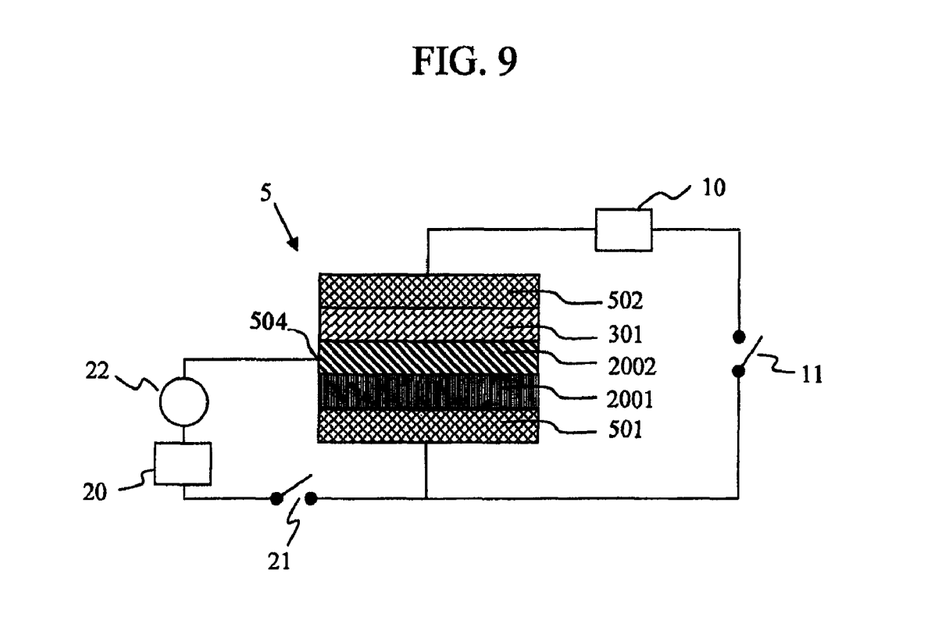
FIG. 9 is a diagram showing a configuration example of an electric field write magnetic recording element of the present invention.
Figure 10:
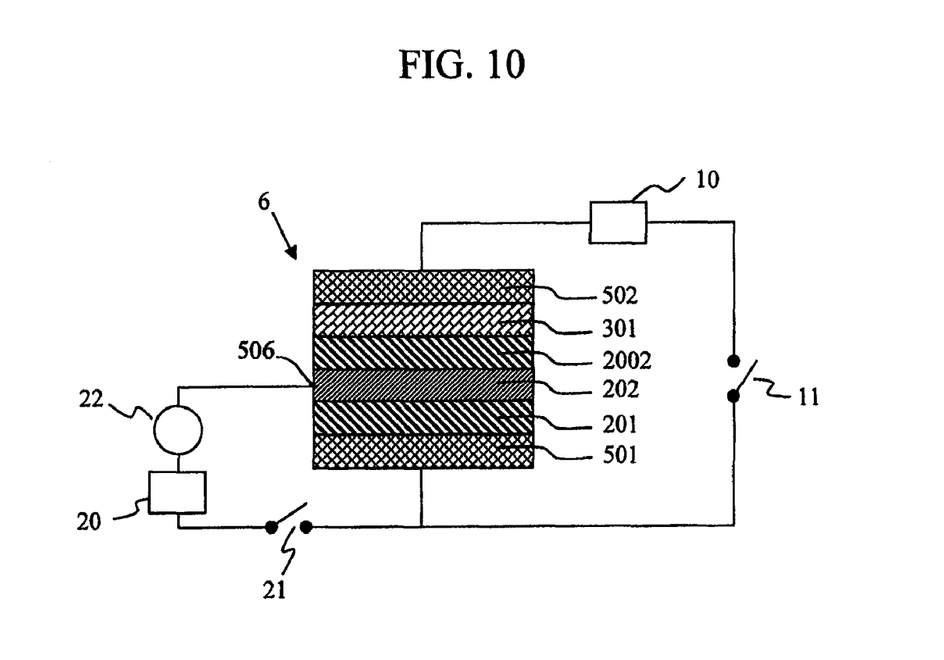
FIG. 10 is a diagram showing a configuration example of an electric field write magnetic recording element of the present invention.

An electric field write magnetic recording element 5 shown in FIG. 9 corresponds to the element shown in FIG. 1 of Embodiment 1, and has a structure in which the read-out layer 2001, the magnetic recording layer 2002, the multiferroic layer 301, and the write electrode layer 502 are layered in this order from the side of the magnetic recording layer in which the electrode layer 501 is provided. A material that exhibits a magnetoresistive effect, such as an anisotropic magnetoresistive effect, a giant magnetoresistive effect, a tunnel magnetoresistive effect, etc., is used for the read-out layer 2001. Further, an electric field write magnetic recording element 6 shown in FIG. 10 corresponds to the element shown in FIG. 2 of Embodiment 1, and is one in which the read-out layer is configured with the barrier layer 202 that is in contact with the magnetic recording layer 2002 and the magnetic fixed layer 201 that is in contact with the barrier layer 202. Further, the detector 22 is coupled to the barrier layer 202 by an electrode 506. It is noted that an element of a structure in which the insulating layer 401 is omitted with respect to the element structures shown in FIGS. 3 and 4 of Embodiment 1 also falls within the scope of the present embodiment.

With respect to the present embodiment, too, the selection of the specific materials forming the respective layers is similar to the mode discussed in Embodiment 1.

Embodiment 3

Figure 11:
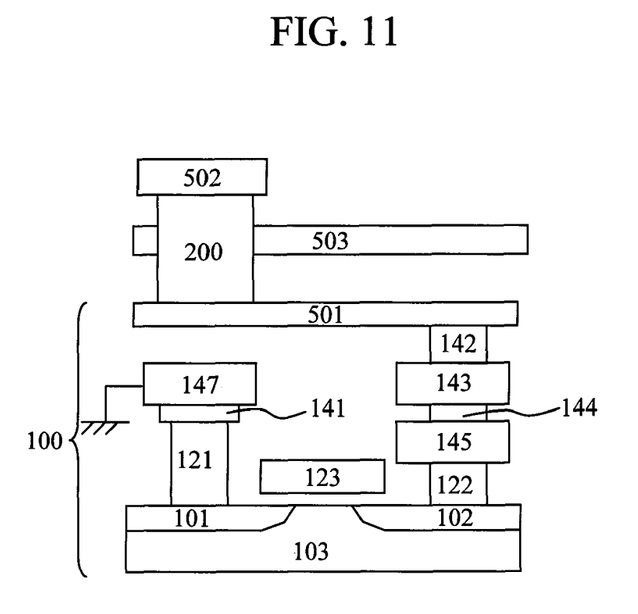
FIG. 11 is a diagram showing a configuration example of a magnetic memory cell using an electric field write magnetic recording element of the present invention.
Figure 12:
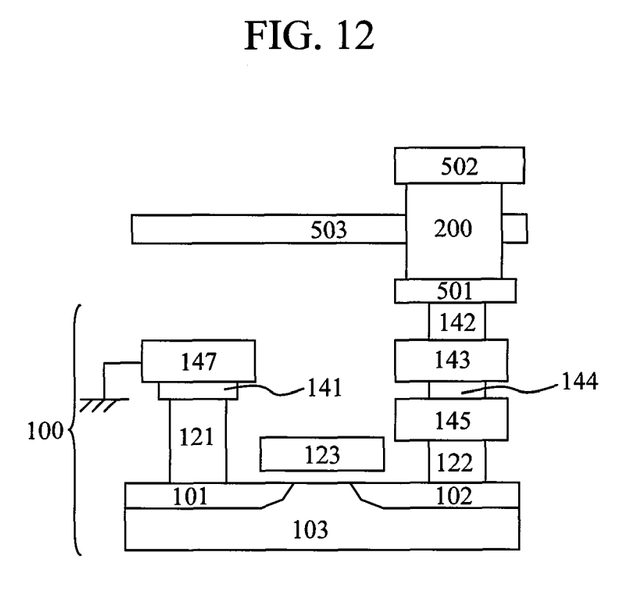
FIG. 12 is a diagram showing a configuration example of a magnetic memory cell using an electric field write magnetic recording element of the present invention.

FIG. 11 and FIG. 12 are schematic sectional views showing configuration examples of a magnetic memory cell according to the present invention. This magnetic memory cell is equipped with the electric field write magnetic recording element 200 indicated in Embodiment 1 or Embodiment 2 as a memory cell.

C-MOS 100 comprises two n-type semiconductors 101, 102 and one p-type semiconductor 103. An electrode 121 that becomes a drain is electrically coupled with the n-type semiconductor 101, and is coupled with ground via electrodes 141, 147. An electrode 122 that becomes a source is electrically coupled with the n-type semiconductor 102. By turning a gate electrode 123 ON/OFF, ON/OFF control for the current between the source electrode 122 and the drain electrode 121 is performed. On the source electrode 122 are layered electrodes 145, 144, 143, 142, and 501, and an electric field write magnetic recording element 200 is coupled.

A bit line 503 is coupled with the magnetic recording layer 2002 of the electric field write magnetic recording element 200. Reading is performed by applying a current or a voltage from the bit line 503 via the transistor 100. In particular, if a barrier layer and a magnetic fixed layer are employed for the read-out layer, reading is performed by way of a tunnel magnetoresistive effect. With a magnetic memory cell of the present embodiment, the magnetization direction of the magnetic recording layer 2002 is controlled by way of the voltage applied to the write electrode 502 of the electric field write magnetic recording element 200.

Figure 13:
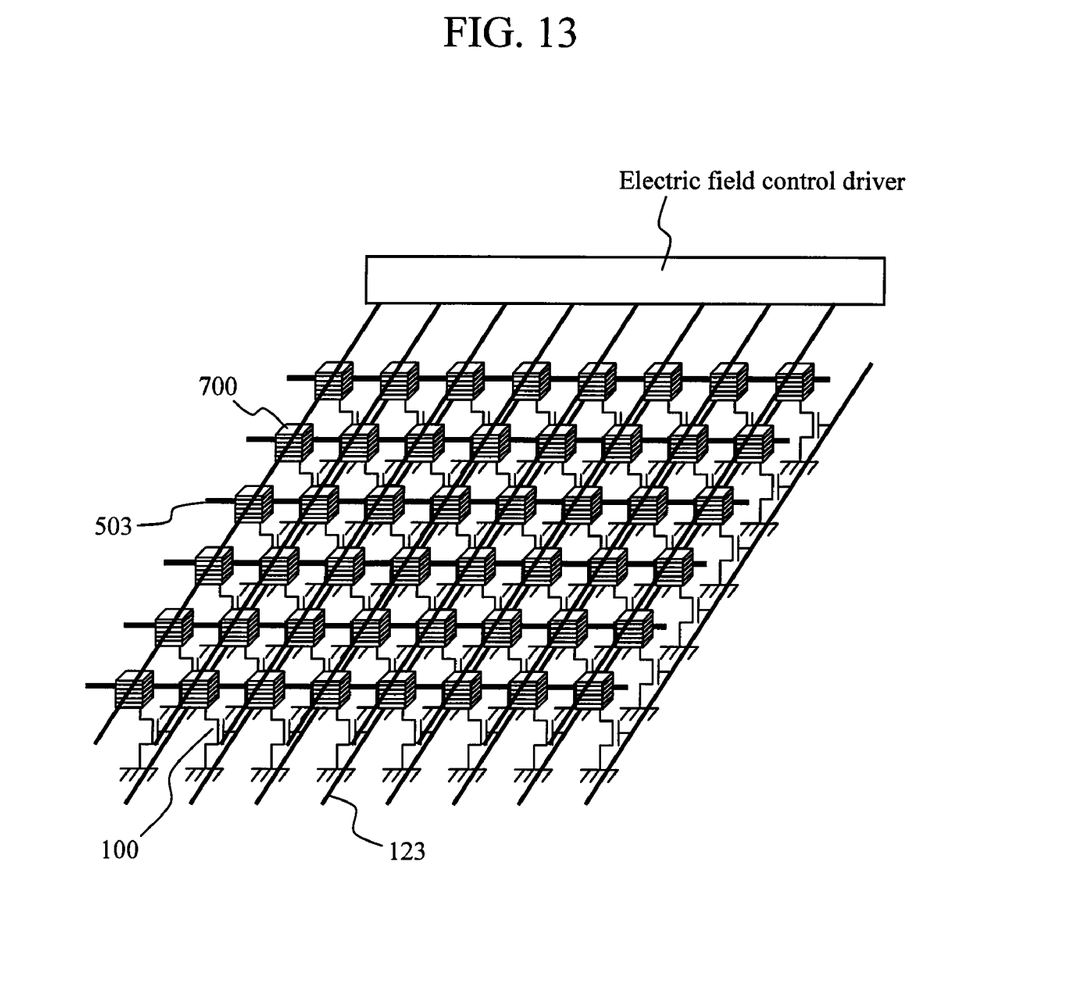
FIG. 13 is a diagram showing a configuration example of a magnetic random access memory using an electric field write magnetic recording element of the present invention.

FIG. 13 is a view showing a configuration example of a magnetic random access memory in which the above-mentioned magnetic memory cell is disposed. The gate electrodes 123 and the bit lines 503 are electrically coupled with magnetic memory cells 700. The recording operation is performed by applying a voltage or a current to the memory cell selected by gate electrode and bit line. Further, with respect to the memory cell selected by transistor, the information of the memory cell is read by way of a change in voltage or resistance across the bit line and the transistor 100. By disposing the magnetic memory cells described in the embodiments above, a high-speed and low-power consumption operation is possible, and it is possible to realize a high-density magnetic memory on the order of gigabits.

Description of Symbols

| | |
|---|---|
| 1-6 | Electric field write magnetic recording element |
| 100 | Transistor |
| 101 | First n-type semiconductor |
| 102 | Second n-type semiconductor |
| 103 | p-type semiconductor |
| 121 | Drain electrode |
| 122 | Source electrode |

-continued

Description of Symbols

| | |
|---|---|
| 123 | Gate electrode |
| 200 | Electric field write magnetic recording element |
| 201 | Magnetic fixed layer |
| 202 | Barrier layer |
| 2001 | Read-out layer |
| 2002 | Magnetic recording layer |
| 2011 | First magnetic layer |
| 2012 | First non-magnetic layer |
| 2013 | Second magnetic layer |
| 20021 | Third magnetic layer |
| 20022 | Second non-magnetic layer |
| 20023 | Fourth magnetic layer |
| 301 | Multiferroic layer |
| 401 | Insulating layer |
| 501 | Electrode layer |
| 502 | Write electrode layer |
| 503 | Bit line |
| 601 | Antiferromagnetic layer |
| 700 | Magnetic memory cell |

The invention claimed is:

1. A magnetic recording element comprising:
   a magnetic recording layer;
   a multiferroic layer provided adjacent to one surface of the magnetic recording layer;
   a read-out layer provided adjacent to another surface of the magnetic recording layer;
   a first electrode layer provided on the same side of the magnetic recording layer as the multiferroic layer is provided;
   a second electrode layer provided on the same side of the magnetic recording layer as the read-out layer is provided; and
   an electrode, different from the first and second electrode layers, coupled with the magnetic recording layer, wherein the magnetic recording layer has its magnetization direction switched by way of magnetic exchange coupling that is at work between itself and the multiferroic layer, the magnetic recording element varies in electric resistance in accordance with the magnetization direction of the magnetic recording layer, magnetic information is written through rotation of the magnetization direction of the magnetic recording layer by applying an electric field to the multiferroic layer via the first electrode layer and the second electrode layer, and a signal from the read-out layer corresponding to the electric resistance of the magnetic recording element is obtained via the second electrode layer and the electrode coupled with the magnetic recording layer.

2. A magnetic recording element according to claim 1, wherein an insulating layer is provided between the multiferroic layer and the first electrode layer.

3. A magnetic recording element according to claim 1, wherein the read-out layer comprises:
   a barrier layer that is adjacent to the magnetic recording layer; and
   a magnetic fixed layer provided between the barrier layer and the second electrode layer.

4. A magnetic recording element according to claim 3, wherein
   the barrier layer comprises MgO, and
   the magnetic recording layer is a body-centered cubic lattice film comprising Co, Fe, Ni, and B.

5. A magnetic recording element according to claim 3, wherein
the magnetic recording layer comprises a first magnetic layer and a second magnetic layer that are provided with a non-magnetic layer sandwiched therebetween, and
magnetizations of the first magnetic layer and the second magnetic layer are coupled in an antiparallel manner.

6. A magnetic recording element according to claim 3, wherein
the magnetic fixed layer comprises a first magnetic layer and a second magnetic layer that are provided with a non-magnetic layer sandwiched therebetween, and
magnetizations of the first magnetic layer and the second magnetic layer are coupled in an antiparallel manner.

7. A magnetic recording element according to claim 1, wherein the multiferroic layer comprises an oxide.

8. A magnetic memory cell comprising:
a magnetic recording element comprising:
a magnetic recording layer;
a multiferroic layer provided adjacent to one surface of the magnetic recording layer;
a read-out layer provided adjacent to another surface of the magnetic recording layer, and whose output signal varies with electric resistance of the magnetic recording element in accordance with a magnetization direction of the magnetic recording layer;
a first electrode layer provided on the same side of the magnetic recording layer as the multiferroic layer is provided;
a second electrode layer provided on the same side of the magnetic recording layer as the read-out layer is provided; and
an electrode, different from the first and second electrode layers, coupled with the magnetic recording layer, wherein the magnetic recording layer has its magnetization direction set by way of magnetic exchange coupling that is at work between itself and the multiferroic layer;
a write circuit comprising:
a first power source; and
a first switching element that performs on/off control of voltage application by the first power source, wherein the write circuit is directly coupled with the first electrode layer and the second electrode layer, and writes magnetic information through rotation of the magnetization direction of the magnetic recording layer by applying an electric field to the multiferroic layer; and
a read-out circuit comprising:
a second power source; and
a second switching element that performs on/off control of a voltage or voltage application by the second power source, wherein the read-out circuit is coupled with the second electrode layer and the electrode coupled with the magnetic recording layer, and obtains a signal corresponding to the electric resistance of the magnetic recording element.

9. A magnetic memory cell according to claim 8, wherein the magnetic recording element comprises an insulating layer between the multiferroic layer and the first electrode layer.

10. A magnetic random access memory comprising a plurality of magnetic memory cells and means that selects a desired magnetic memory cell, each of the magnetic memory cells comprising:
a magnetic recording element comprising:
a magnetic recording layer;
a multiferroic layer provided adjacent to one surface of the magnetic recording layer;
a read-out layer provided adjacent to another surface of the magnetic recording layer, and whose output signal varies with electric resistance of the magnetic recording element in accordance with a magnetization direction of the magnetic recording layer;
a first electrode layer provided on the same side of the magnetic recording layer as the multiferroic layer is provided;
a second electrode layer provided on the same side of the magnetic recording layer as the read-out layer is provided; and
an electrode, different from the first and second electrode layers, coupled with the magnetic recording layer, wherein the magnetic recording layer has its magnetization direction set by way of magnetic exchange coupling that is at work between itself and the multiferroic layer;
a write circuit comprising:
a first power source; and
a first switching element that performs on/off control of voltage application by the first power source, wherein the write circuit is directly coupled with the first electrode layer and the second electrode layer, and writes magnetic information through rotation of the magnetization direction of the magnetic recording layer by applying an electric field to the multiferroic layer; and
a read-out circuit comprising:
a second power source; and
a second switching element that performs on/off control of a voltage or voltage application by the second power source, wherein the read-out circuit is coupled with the second electrode layer and the electrode coupled with the magnetic recording layer, and obtains a signal corresponding to the electric resistance of the magnetic recording element.

11. A magnetic random access memory according to claim 10, wherein the magnetic recording element comprises an insulating layer between the multiferroic layer and the first electrode layer.

* * * * *